(12) United States Patent
Toba et al.

(10) Patent No.: US 8,283,791 B2
(45) Date of Patent: Oct. 9, 2012

(54) SEMICONDUCTOR DEVICE AND METHOD FOR MANUFACTURING SAME

(75) Inventors: Takayuki Toba, Kanagawa-ken (JP); Tohru Ozaki, Tokyo (JP); Toshiki Hisada, Kanagawa-ken (JP); Hiromitsu Mashita, Kanagawa-ken (JP); Takafumi Taguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 13/051,652

(22) Filed: Mar. 18, 2011

(65) Prior Publication Data

US 2012/0001331 A1 Jan. 5, 2012

(30) Foreign Application Priority Data

Jul. 1, 2010 (JP) ................................. 2010-151020

(51) Int. Cl.
*H01L 23/48* (2006.01)
*H01L 23/52* (2006.01)
*H01L 29/40* (2006.01)
(52) U.S. Cl. ......... 257/786; 257/758; 438/622; 438/637
(58) Field of Classification Search .................. 257/786, 257/784, 758, 208, 210, 211; 438/622, 629, 438/637, 672
See application file for complete search history.

(56) References Cited

U.S. PATENT DOCUMENTS

| | | | |
|---|---|---|---|
| 6,381,166 B1 * | 4/2002 | Yoshida et al. .................. 365/63 |
| 7,244,984 B2 * | 7/2007 | Kamigaichi et al. .......... 257/315 |
| 7,679,108 B2 | 3/2010 | Matsunaga et al. | |
| 2005/0124095 A1 * | 6/2005 | Liaw ............................. 438/128 |
| 2006/0289914 A1 * | 12/2006 | Juengling ..................... 257/296 |
| 2007/0111512 A1 * | 5/2007 | Murata et al. ................. 438/622 |
| 2008/0137421 A1 | 6/2008 | Kai et al. | |
| 2009/0194879 A1 | 8/2009 | Endo et al. | |
| 2011/0188309 A1 * | 8/2011 | Endo ........................ 365/185.05 |
| 2011/0260335 A1 * | 10/2011 | Takeshima ..................... 257/774 |
| 2012/0020158 A1 * | 1/2012 | Ozaki et al. ............... 365/185.05 |
| 2012/0119368 A1 * | 5/2012 | Kato et al. ..................... 257/773 |

FOREIGN PATENT DOCUMENTS

JP 2009-187988 8/2009

* cited by examiner

*Primary Examiner* — S. V Clark
(74) *Attorney, Agent, or Firm* — Oblon, Spivak, McClelland, Maier & Neustadt, L.L.P.

(57) ABSTRACT

According to one embodiment, a semiconductor device includes a plurality of first interconnects, a second interconnect, a third interconnect, and a plurality of conductive members. The plurality of first interconnects are arranged periodically to extend in one direction. The second interconnect is disposed outside a group of the plurality of first interconnects to extend in the one direction. The third interconnect is provided between the group and the second interconnect. The plurality of conductive members are disposed on a side opposite to the group as viewed from the second interconnect. A shortest distance between the first interconnect and the third interconnect, a shortest distance between the third interconnect and the second interconnect, and a shortest distance between the first interconnects are equal. A shortest distance between the second interconnect and the conductive member is longer than the shortest distance between the first interconnects.

20 Claims, 15 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2010-151020, filed on Jul. 1, 2010; the entire contents of which are incorporated herein by reference.

FIELD

Embodiments described herein relate generally to a semiconductor device and a method for manufacturing the same.

BACKGROUND

In recent years, NAND flash memory which is a large-capacity and low-cost nonvolatile semiconductor memory device has been used as storage memory such as memory cards and semiconductor disks, e.g., SSDs (Solid State Disks); and applications and markets are growing. There is a need for even larger capacities and lower costs of storage memory; and downscaling of the patterning dimensions of NAND flash memory has progressed to realize larger capacities and lower costs.

Known methods of forming an interconnect pattern having a line-and-space (L/S) configuration on a substrate include a damascene process in which a conductive material is filled into a trench made in an insulating film. Known methods of forming an L/S pattern having an ultra-fine arrangement period exceeding the resolution limit of the lithography include a so-called sidewall method. By combining the sidewall method and the damascene process, an interconnect pattern having an ultra-fine arrangement period can be formed. In other words, a pattern having an L/S configuration is formed on an insulating film using lithography; slimming of the pattern is performed; and sidewalls are formed on the side faces thereof. Thereby, sidewalls having an ultra-fine arrangement period exceeding the resolution limit of the lithography are formed. Then, etching is performed using the sidewalls as a mask to make trenches in the insulating film. Interconnects are formed in the trenches by filling a conductive material into the trenches and planarizing the upper face using CMP (chemical mechanical polishing) and the like. In such a case, the interconnects are formed in the regions directly under the regions between the sidewalls; and the regions directly under the sidewalls are the regions between the interconnects.

DETAILED DESCRIPTION

Figure 1:
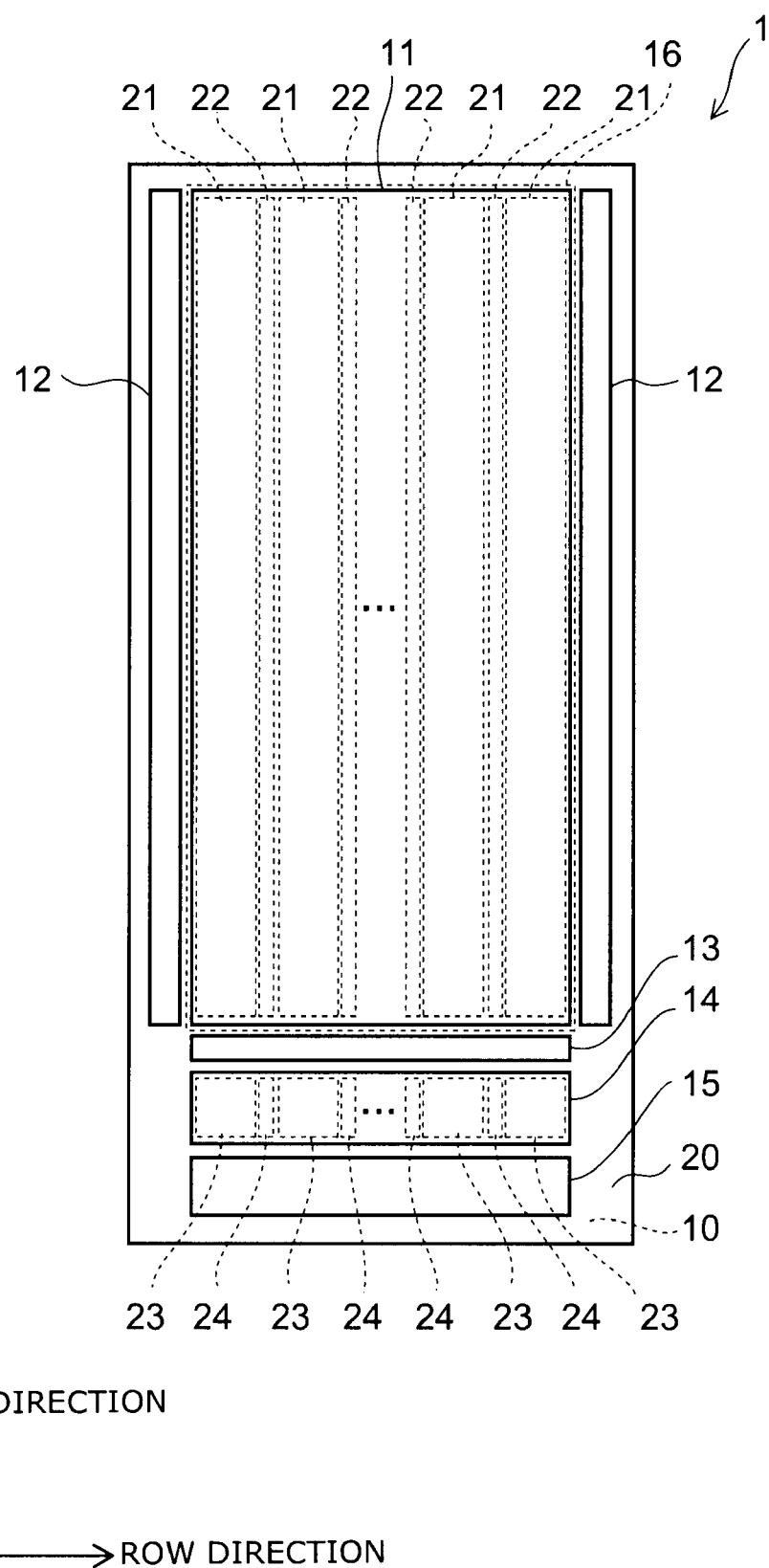
FIG. 1 is a schematic plan view illustrating a semiconductor device according to a first embodiment.

In general, according to one embodiment, a semiconductor device includes a plurality of first interconnects, a second interconnect, a third interconnect, and a plurality of conductive members. The plurality of first interconnects are arranged periodically to extend in one direction. The second interconnect is disposed outside a group of the plurality of first interconnects to extend in the one direction. The third interconnect is provided between the group and the second interconnect. The plurality of conductive members are disposed on a side opposite to the group as viewed from the second interconnect. A shortest distance between the first interconnect and the third interconnect, a shortest distance between the third interconnect and the second interconnect, and a shortest distance between the first interconnects are equal. A shortest distance between the second interconnect and the conductive member is longer than the shortest distance between the first interconnects.

According to another embodiment, a method is disclosed for manufacturing a semiconductor device. The method can include forming a first insulating film on a semiconductor substrate. A first region and a second region are set alternately in the semiconductor substrate along a first direction. The method can include forming a second insulating film on the first insulating film. The method can include forming a third insulating film on the second insulating film. The method can include forming a first resist pattern on the third insulating film. The first resist pattern includes a plurality of line patterns arranged periodically along the first direction in the second region to extend in a second direction orthogonal to the first direction. The method can include dividing the third insulating film into a plurality of line portions by etching method using the first resist pattern as a mask. The method can include reducing a width of the line portion. The method can include forming a sidewall on a side face of the line portion. The method can include removing the line portion. The method can include forming a second resist pattern in a region of the first region separated from the sidewall. An opening is provided in an interior of the second resist pattern. The method can include making a trench in a region of the second insulating film between the sidewalls and in a region of the second insulating film between the sidewall and the second resist pattern, and making a recess in a region of the second insulating film directly under the opening, by etching method using the sidewall and the second resist pattern as a mask. In addition, the method can include forming an interconnect in an interior of the trench and a conductive film in an interior of the recess by filling a conductive material into the interior of the trench and the interior of the recess. A shortest distance from the opening to an outer edge of the second resist pattern on the second region side is longer than a width of the sidewall.

Embodiments of the invention will now be described with reference to the drawings.

First, a first embodiment will be described.

FIG. 1 is a schematic plan view illustrating a semiconductor device according to this embodiment.

Figure 2:
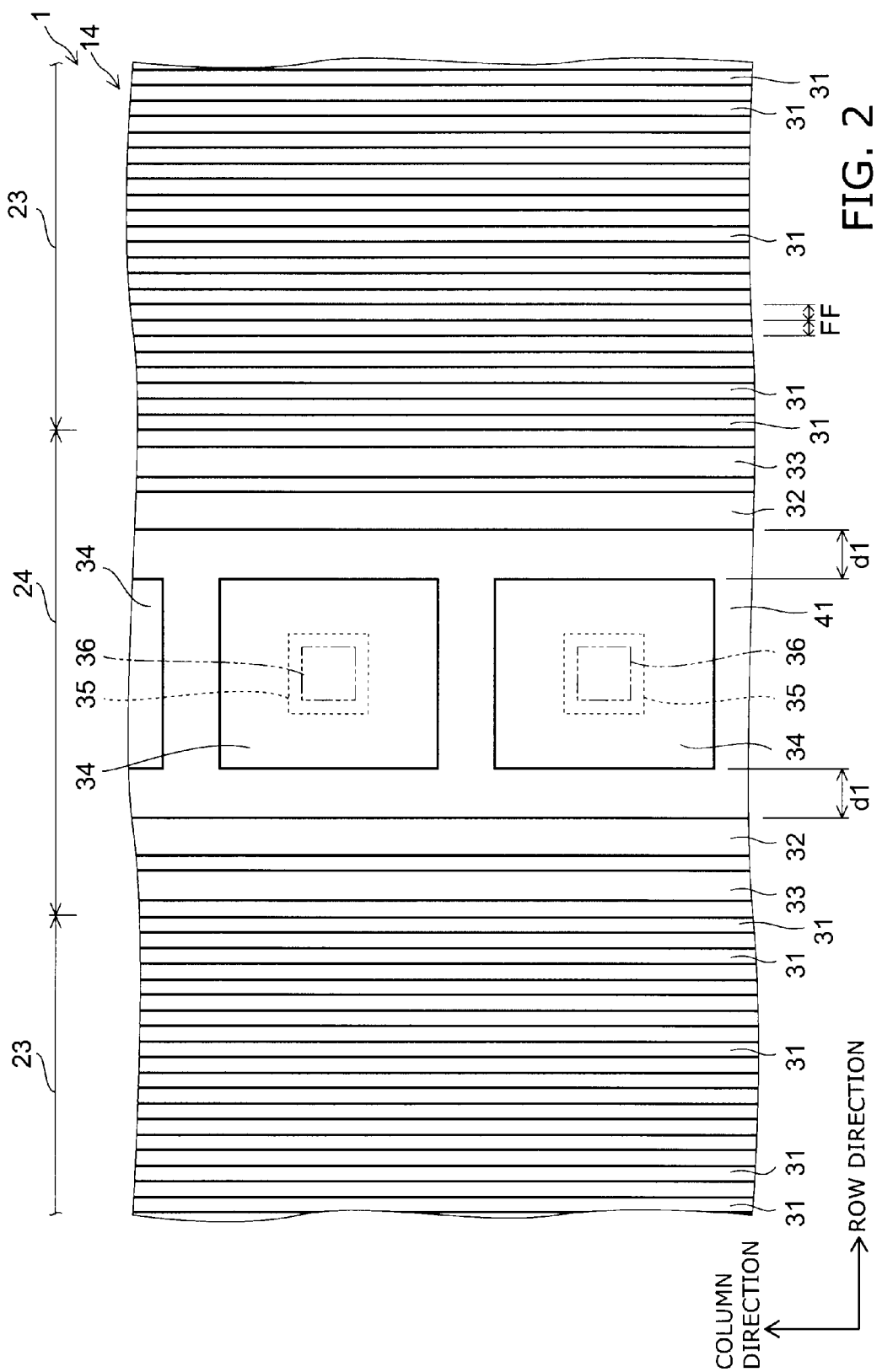
FIG. 2 is a plan view illustrating an interconnect pattern of a page buffer of the semiconductor device according to the first embodiment.

FIG. 2 is a plan view illustrating an interconnect pattern of a page buffer of the semiconductor device according to this embodiment.

As illustrated in FIG. 1, the semiconductor device 1 according to this embodiment is a NAND flash memory. A semiconductor substrate 10 made of, for example, silicon is provided in the semiconductor device 1; and a multilayered interconnect film 20 is provided on the semiconductor substrate 10. Herein, two mutually orthogonal directions parallel to the upper face of the semiconductor substrate 10 are taken as a "row direction" and a "column direction." A memory cell array 11 is formed in the upper face of the semiconductor substrate 10 and thereabove; and row decoders 12 are formed on both row-direction sides of the memory cell array 11. A switching region 13, a page buffer 14, and a peripheral circuit 15 are disposed in this order in one column direction as viewed from the memory cell array 11.

A cell well 16 is formed in the upper layer portion of the semiconductor substrate 10 in the memory cell array 11. A memory cell region 21 and a shunt region 22 are arranged alternately along the row direction in the memory cell array 11. In the memory cell region 21, multiple element-separating insulators (not illustrated) are formed mutually parallel with a constant period in the upper layer portion of the cell well 16 of the semiconductor substrate 10 to extend in the column direction; and portions of the cell well 16 between the element-separating insulators form active areas (not illustrated). Multiple bit lines (not illustrated) are provided in an interconnect layer of the lowermost layer of the multilayered interconnect film 20. The bit lines are disposed in the regions directly on the active areas.

In the shunt region 22, a conductive film (not illustrated) having a band configuration extending in the column direction is provided in the interconnect layer of the lowermost layer of the multilayered interconnect film 20; a power source interconnect (not illustrated) is provided in an interconnect layer which is a layer higher than the interconnect layer of the lowermost layer of the multilayered interconnect film 20; a contact is provided between the semiconductor substrate 10 and the conductive film; and a contact is provided also between the conductive film and the power source interconnect. The contacts of each layer are arranged in one series along the column direction.

In the page buffer 14 as illustrated in FIG. 1 and FIG. 2, a bit line region 23 and a shunt region 24 are disposed alternately along the row direction. Sense amplifier circuits (not illustrated) are formed in the upper face of the semiconductor substrate 10 of the page buffer 14. Circuit elements such as MOSFETs (Metal-Oxide-Semiconductor Field-Effect Transistors) and the like are provided in the sense amplifier circuits. Further, a bit line 31 (a first interconnect), an interconnect 32 (a second interconnect), an interconnect 33 (a third interconnect), and a conductive film 34 are provided in the interconnect layer of the lowermost layer of the multilayered interconnect film 20. In other words, the bit line 31, the interconnect 32, the interconnect 33, and the conductive film 34 are formed in the same interconnect layer.

The multiple bit lines 31 (the first interconnects) arranged periodically along the row direction to extend in the column direction are provided in the bit line region 23. The interconnect 32 (the second interconnect) extending in the column direction is provided outside a group of the multiple bit lines 31 arranged in each of the bit line regions 23 with a constant period, that is, at both row-direction end portions of each of the shunt regions 24. The width of the interconnect 32 is different from the width of the bit line 31 and is, for example, greater than the width of the bit line 31. The interconnect 33 (the third interconnect) is provided between the interconnect 32 and the group of the multiple bit lines 31 to extend in the column direction. The width of the interconnect 33 is greater than the width of the bit line 31.

The multiple conductive films 34 arranged in one series along the column direction are provided in regions of the shunt region 24 other than both row-direction end portions. In other words, the conductive films 34 are disposed on the side opposite to the group of the multiple bit lines 31 as viewed from the interconnect 32 and can be said to be interposed between the interconnects 32. The configuration of each of the conductive films 34 as viewed from above is a rectangle having a length in the column direction slightly longer than the length in the row direction. A shortest distance d1 between the interconnect 32 and the conductive film 34 is longer than a distance F between the bit lines 31. The shortest distance between the bit line 31 and the interconnect 33 and the shortest distance between the interconnect 33 and the interconnect 32 are substantially equal to the distance between the bit lines 31.

A contact 35 is provided in the multilayered interconnect film 20 in the region directly under the conductive film 34 in the shunt region 24. The upper end of the contact 35 is connected to the conductive film 34; and the lower end is connected to the circuit element of the sense amplifier circuit formed in the upper face of the semiconductor substrate 10. A contact 36 is provided in the multilayered interconnect film 20 in region directly on the conductive film 34. The contact 36 is provided in the region directly on the contact 35; the lower end of the contact 36 is connected to the conductive film 34; and the upper end of the contact 36 is connected to an upper layer interconnect, e.g., the power source interconnect (not illustrated), provided in the interconnect layer that is a higher layer. Thereby, the upper layer interconnect is connected to the circuit element of the sense amplifier circuit, e.g., a source layer, a drain layer, etc., of a MOSFET, via the contact 36, conductive film 34, and the contact 35.

The number of the bit lines 31 provided in the bit line region 23 of the page buffer 14 may be less than the number of the bit lines provided in the memory cell region 21 of the memory cell array 11. Therefore, there are cases where the length of the bit line region 23 in the row direction is shorter than the length of the memory cell region 21. Also, there are cases where the length of the shunt region 24 in the row direction is different from the length of the shunt region 22.

The shunt region 24 of the page buffer 14 is a region to connect the upper layer interconnect to the circuit element of the sense amplifier circuit. For example, in the case where the upper layer interconnect is the power source interconnect, a power supply potential is applied to the power source interconnect and is applied to the circuit element via the contact 36, the conductive film 34, and the contact 35. Because a potential is applied independently to each of the circuit elements, the conductive film 34 is separate for every contact 35 according to the applied potential and the position of the circuit element.

Conversely, the shunt region 22 of the memory cell array 11 is a region to connect the upper layer interconnect to the cell well 16 to apply, for example, a potential to the cell well 16. Because the cell well 16 is formed over the entire memory cell array 11, the multiple contacts provided in each of the shunt regions 22 are connected from the same power source interconnect to the same cell well 16. Accordingly, it is favorable for the conductive film described above provided in the shunt region 22 to not be divided for every contact, to extend along the column direction, and to have a common connection with the contacts provided in one shunt region 22 to reduce the resistance value.

Switching elements (not illustrated) are provided in the switching region 13 to switch whether or not the bit lines provided in the memory cell region 21 of the memory cell array 11 are connected to the bit lines 31 provided in the bit line region 23 of the page buffer 14. The switching elements are, for example, MOSFETs. The bit lines of the memory cell region 21 are connected to the bit lines 31 of the bit line region 23 via the switching elements.

A method for manufacturing the semiconductor device according to this embodiment will now be described.

Figure 3:
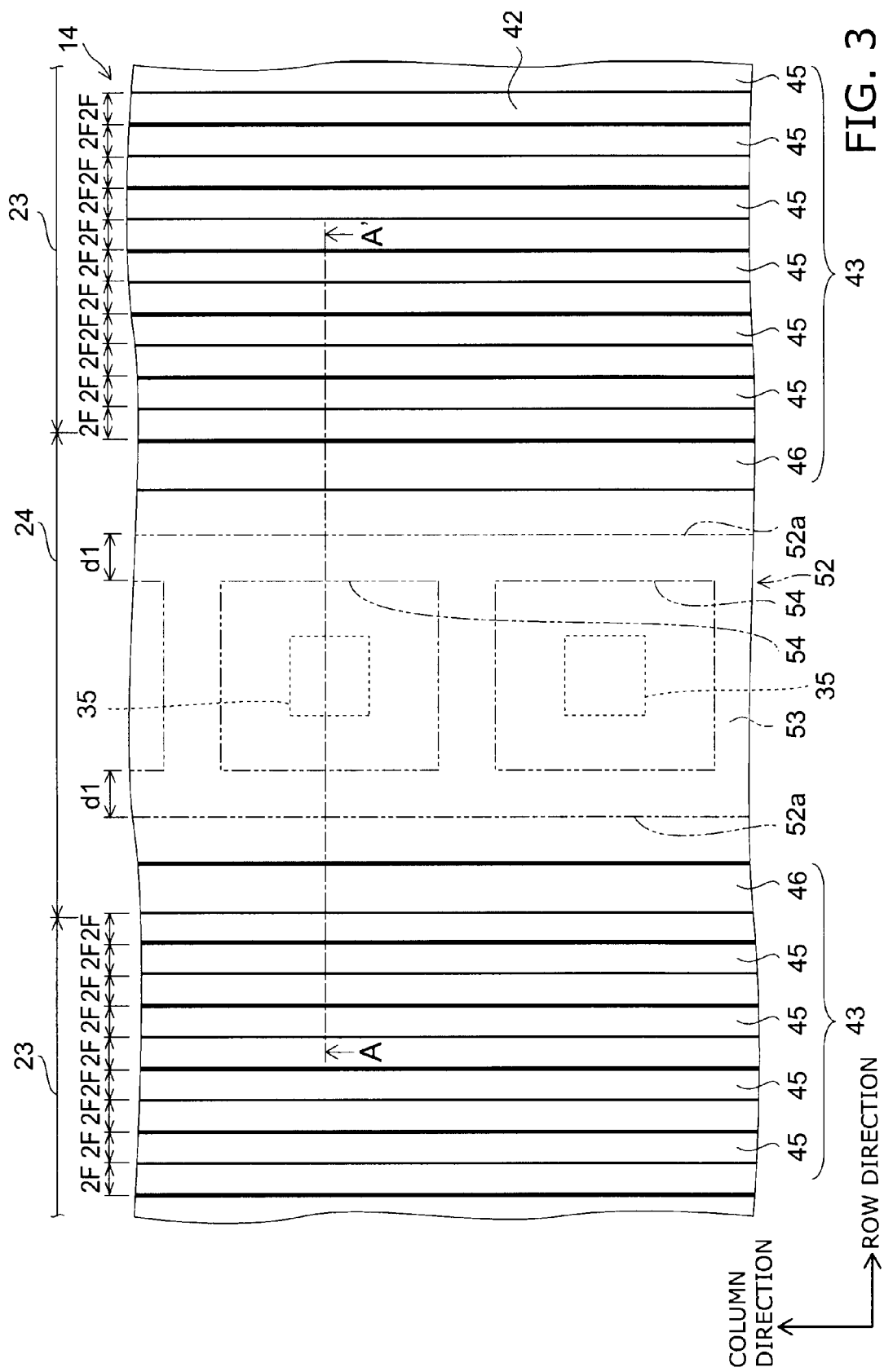
FIG. 3 is a process plan view illustrating a method for manufacturing the semiconductor device according to the first embodiment.

FIG. 3 is a process plan view illustrating the method for manufacturing the semiconductor device according to this embodiment.

Figure 4:
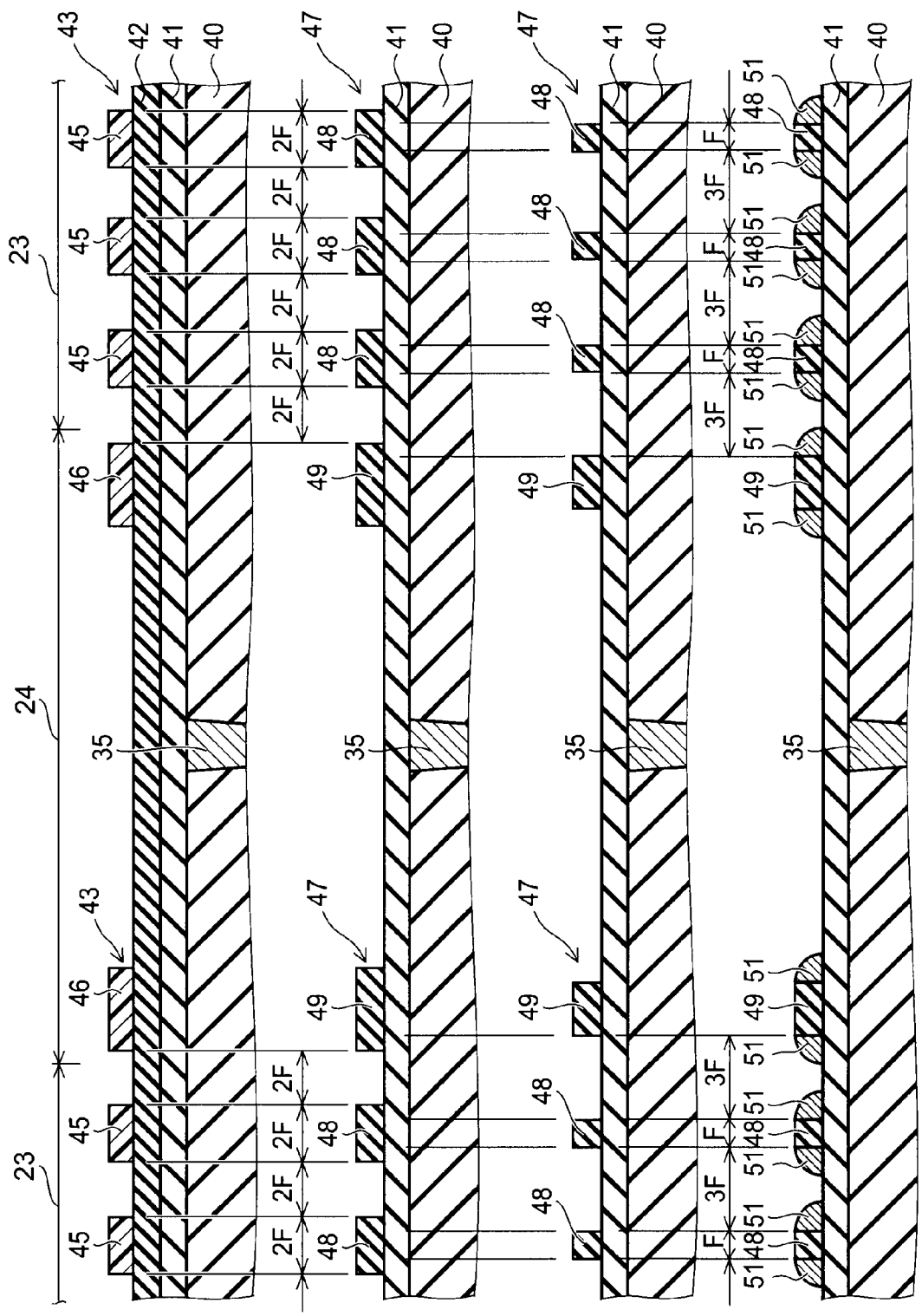
FIGS. 4A to 4D are cross-sectional views of processes, illustrating the method for manufacturing the semiconductor device according to the first embodiment.

FIGS. 4A to 4D and FIGS. 5A to 5D are cross-sectional views of processes, illustrating the method for manufacturing the semiconductor device according to this embodiment; and FIG. 4A is a cross-sectional view along line A-A' illustrated in FIG. 3.

First, as illustrated in FIG. 1, the semiconductor substrate 10 is prepared. The semiconductor substrate 10 is, for example, one portion of a silicon wafer. Regions are set in the semiconductor substrate 10 to form the memory cell array 11, the row decoders 12, the switching region 13, the page buffer 14, and the peripheral circuit 15. The memory cell region 21 and the shunt region 22 are arranged alternately along the row direction in the region where the memory cell array 11 is to be formed. The bit line region 23 and the shunt region 24 are disposed alternately along the row direction in the region where the page buffer 14 is to be formed.

Then, the cell well 16 is formed in the upper layer portion of the semiconductor substrate 10 in the region where the memory cell array 11 is to be formed. Then, multiple active areas (not illustrated) are formed to extend in the column direction by partitioning the upper layer portion of the cell well 16 by an element-separating insulator (not illustrated). The sense amplifier circuits (not illustrated) are formed in the upper face of the semiconductor substrate 10 of the page buffer 14.

The description will now focus on the method for constructing the page buffer 14.

As illustrated in FIG. 3 and FIG. 4A, circuit elements (not illustrated) such as transistors are formed on the semiconductor substrate 10. Then, an inter-layer insulating film 40 is formed to cover the circuit elements. Continuing, a contact hole is made in the inter-layer insulating film 40; and a metal material, e.g., tungsten, is filled into the contact hole to form the contact 35. Here, the contact 35 is formed in substantially the row-direction center of the shunt region 24. Then, an inter-layer insulating film 41 made of, for example, silicon oxide is formed on the inter-layer insulating film 40 and the contact 35. Continuing, an inter-layer insulating film 42 made of, for example, silicon nitride is formed on the inter-layer insulating film 41. Then, a resist film is formed on the entire surface of the inter-layer insulating film 42 and is patterned using photolithography. Thereby, a resist pattern 43 is formed on the inter-layer insulating film 42. In the resist pattern 43, multiple mutually-separated line patterns 45 are provided periodically to extend in the column direction in the bit line region 23. The arrangement period of the line pattern 45 is, for example, the minimum realizable period using photolithography. In this embodiment, the width of the line pattern 45 is taken to be 2F; and the distance between the mutually adjacent line patterns 45 also is taken to be 2F.

One line pattern 46 is provided to extend in the column direction at each of both row-direction end portions of the shunt region 24. In other words, two line patterns 46 are formed in the shunt region 24 such that the contact 35 is positioned between the two line patterns 46 as viewed from above. The width of the line pattern 46 is greater than the width (2F) of the line pattern 45. The width of the line pattern 46 is adjusted to relax the fineness of the pattern of the resist pattern 43 such that the line pattern 45 can be formed stably. The distance from the line pattern 46 to the line pattern 45 most proximal to the line pattern 46 is substantially equal to the distance (2F) between the mutually adjacent line patterns 45 and accordingly is 2F. On the other hand, the resist pattern 43 is not provided in the shunt region 24 except for both row-direction end portions of the shunt region 24. The distance between the line patterns 46 in the shunt region 24 is greater than 2F.

Then, as illustrated in FIG. 4B, dry etching is performed by using the resist pattern 43 as a mask. Thereby, the inter-layer insulating film 42 is selectively removed to be patterned into a mask pattern 47 having the same pattern as the resist pattern 43. In other words, using dry etching, the inter-layer insulating film 42 is divided into multiple line portions 48 and 49. The line portions 48 are positioned in the regions directly under the line patterns 45; and the line portion 49 is positioned in the region directly under the line pattern 46. Accordingly, the width of the line portion 48 is 2F; the distance between the line portions 48 is 2F; and the shortest distance between the line portion 48 and the line portion 49 also is 2F. Subsequently, the resist pattern 43 is removed.

Then, as illustrated in FIG. 4C, slimming of the line portions 48 and 49 is performed by performing, for example, isotropic etching on the entire surface. Thereby, the width of the line portion 48 is substantially F. As a result, the distance between the mutually adjacent line portions 48 is substantially 3F. The shortest distance between the line portion 48 and the line portion 49 also is substantially 3F.

Continuing as illustrated in FIG. 4D, a silicon film, for example, is formed on the entire surface; and etch-back is performed by performing, for example, anisotropic etching. Thereby, the silicon film remains only on the side faces of the line portions 48 and 49 to form sidewalls 51. The thickness of the sidewall 51 is taken to be F. Subsequently, the line portions 48 and 49 are removed.

Figure 5:
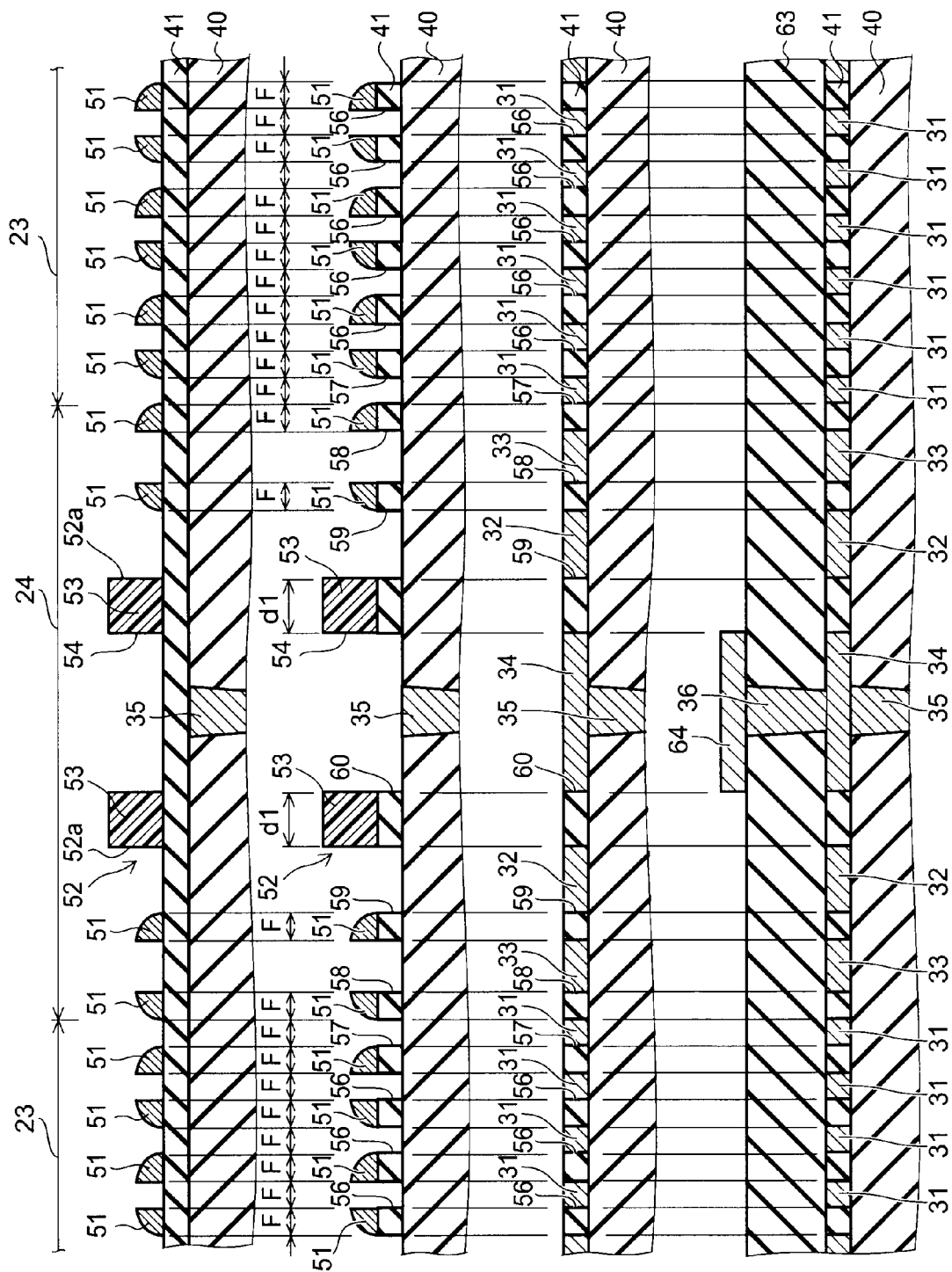
FIGS. 5A to 5D are cross-sectional views of processes, illustrating the method for manufacturing the semiconductor device according to the first embodiment.

Then, as illustrated in FIG. 5A, a resist pattern 52 is formed by forming a resist film on the entire surface and by patterning using photolithography. The resist pattern 52 is formed in a band-like portion 53 to extend in the column direction in the region of the shunt region 24 except for both row-direction end portions. Multiple openings 54 having rectangular configurations arranged in one series along the column direction are made in the band-like portion 53. In other words, the configuration of the band-like portion 53 as viewed from above is a ladder-like configuration. The openings 54 are made such that the contacts 35 are disposed in the openings 54 as viewed from above. In such a case, the shortest distance d1 from the opening 54 to an outer edge 52a of the resist pattern 52 on the bit line region 23 side is greater than the width F of the sidewall 51. The resist pattern 52 may cover both column-direction end portions of the sidewall 51 at both column-direction end portions of the bit line region 23.

Continuing as illustrated in FIG. 5B, dry etching, for example, is performed using the sidewall 51 and the resist pattern 52 as a mask. Thereby, the portions of the inter-layer insulating film 41 other than the regions directly under the sidewall 51 and the resist pattern 52 are removed to make trenches 56 to 59 and a recess 60. In other words, the trench 56 is made in the region directly under the region between the sidewalls 51 formed on the side face of the line portion 48 (referring to FIG. 4D). The trench 57 is made in the region directly under the region between the sidewall 51 formed on the side face of the line portion 49 side of the line portion 48 most proximal to the line portion 49 and the sidewall 51 formed on the side face of the line portion 48 side of the line portion 49 (referring to FIG. 4D). The trench 58 is made in the region directly under the region between the sidewalls 51 formed on both side faces of the line portion 49. The trench 59 is made in the region directly under the region between the resist pattern 52 and the sidewall 51 formed on the side face of the resist pattern 52 side of the line portion 49. The recess 60 is made in the region directly under the opening 54 of the resist pattern 52. The upper face of the contact 35 is exposed at the bottom face of the recess 60. Then, the sidewall 51 and the resist pattern 52 are removed.

Then, as illustrated in FIG. 5C, a metal material, e.g., copper, is deposited on the entire surface of the inter-layer insulating films 40 and 41 to form a metal film. Then, CMP is performed to remove the portion of the metal film formed on the upper face of the inter-layer insulating film 41 and leave the metal film in the trenches 56 to 59 and in the recess 60. Thereby, the metal material is filled into the trenches 56 to 59 and into the recess 60. Thus, the bit lines 31 are formed in the trenches 56 and in the trench 57; the interconnect 33 is formed in the trench 58; the interconnect 32 is formed in the trench 59; and the conductive film 34 is formed in the recess 60. The conductive film 34 is connected to the contact 35.

Continuing as illustrated in FIG. 5D, an inter-layer insulating film 63 is formed on the inter-layer insulating film 41. Then, a contact hole is made in the inter-layer insulating film 63 in the region directly on the contact 35; and a metal material, e.g., aluminum, is filled into the contact hole to form the contact 36. The contact 36 is connected to the conductive film 34. Then, an upper layer interconnect 64 is formed on the inter-layer insulating film 63 to connect to the contact 36. Thereafter, the multilayered interconnect film 20 is formed by repeatedly forming the inter-layer insulating films, the contacts, and the interconnects as necessary. Thus, the semiconductor device 1 is manufactured.

Operational effects of this embodiment will now be described.

In this embodiment, the bit line 31 can be formed with an arrangement period finer than the resolution limit of the exposure by using a sidewall method and a damascene process in combination. In other words, in the process illustrated in FIG. 4A, the resist pattern 43 including the multiple line patterns 45 which have a width and a spacing having a length (2F) near the resolution limit of the exposure is formed; in the process illustrated in FIG. 4B, the resist pattern 43 is transferred onto the mask pattern 47; in the process illustrated in FIG. 4C, slimming of the line portions 48 of the mask pattern 47 is performed until the width is changed from 2F to F; in the process illustrated in FIG. 4D, the sidewalls 51 are formed with a thickness of F on the side faces of the line portions 48; in the process illustrated in FIG. 5A, the line portions 48 are removed; in the process illustrated in FIG. 5B, the trenches 56 and 57 are made by etching method using the sidewalls 51 as a mask; and in the process illustrated in FIG. 5C, the metal material is filled into the trenches 56 and 57 to form the bit lines 31. Thereby, the multiple bit lines 31 having a width and a spacing of F can be formed.

In this embodiment, the interconnect 32 and the conductive film 34 are formed by forming the resist pattern 52 separately from the resist pattern 43 such that the shortest distance d1 from the opening 54 to the outer edge 52a of the resist pattern 52 is greater than the width F of the sidewall 51 in the process illustrated in FIG. 5A; etching method using the sidewall 51 and the resist pattern 52 as a mask to make the trench 59 between the sidewall 51 and the resist pattern 52 and to make the recess 60 in the region directly under the opening 54 in the process illustrated in FIG. 5B; and filling the metal material into the trench 59 and into the recess 60 in the process illustrated in FIG. 5C. Thereby, the shortest distance d1 between the interconnect 32 and the conductive film 34 can be longer than the distance F between the bit lines 31. As a result, the conductive film 34 can be sufficiently separated from the interconnect 32 adjacent thereto; and a potential higher than the potential applied to the bit line 31 can be applied to the conductive film 34.

Conversely, supposing that the interconnect and the conductive film are formed using only a sidewall method and a damascene process, although any width of the interconnect and the conductive film can be selected by the width of each of the line patterns of the resist pattern 43, the distance between the interconnect and the conductive film undesirably is determined by the thickness of the sidewall. Because the thickness of the sidewall cannot be different for each of the positions on the semiconductor substrate 10, the distance between the conductive film 34 and the interconnect 32 undesirably is equal to the distance between the bit lines 31. As a result, when reducing the distance between the bit lines 31 for higher integration of the semiconductor device, the distance between the conductive film 34 and the interconnect 32 is undesirably shorter and the potential applicable to the conductive film 34 is undesirably constrained.

Further, even in the case where the width and the formation position of the resist pattern 52 fluctuate, the fluctuation thereof can be absorbed by the interconnect 32 by setting the target value of the width of the interconnect 32 to be greater than the target value of the width of the bit line 31. In other words, although the width of the interconnect 32 fluctuates with respect to the target value thereof when the width and the formation position of the resist pattern 52 fluctuate, the interconnect 32 is not discontinuous as long as the target value of the width of the interconnect 32 is set to be greater than the fluctuation amount of the width and the formation position of the resist pattern 52. In other words, because the interconnect 32 is used as a dummy pattern to absorb the process fluctuation of the resist pattern 52, it is sufficient to set the width of the interconnect 32 such that the pattern of the interconnect 32 does not collapse and affect the pattern of the adjacent bit line 31 and interconnect 33. Thereby, even in the case where process fluctuation occurs, the operations of the semiconductor device 1 can be stabilized. For example, in the case where the interconnect 33 is used as a dummy interconnect for shielding, the configuration of the interconnect 33 can be stabilized by using the interconnect 32 as a dummy pattern. As a result, the shielding effect can be improved and the operations of the semiconductor device 1 can be stabilized.

A variation of this embodiment will now be described.

Figure 6:
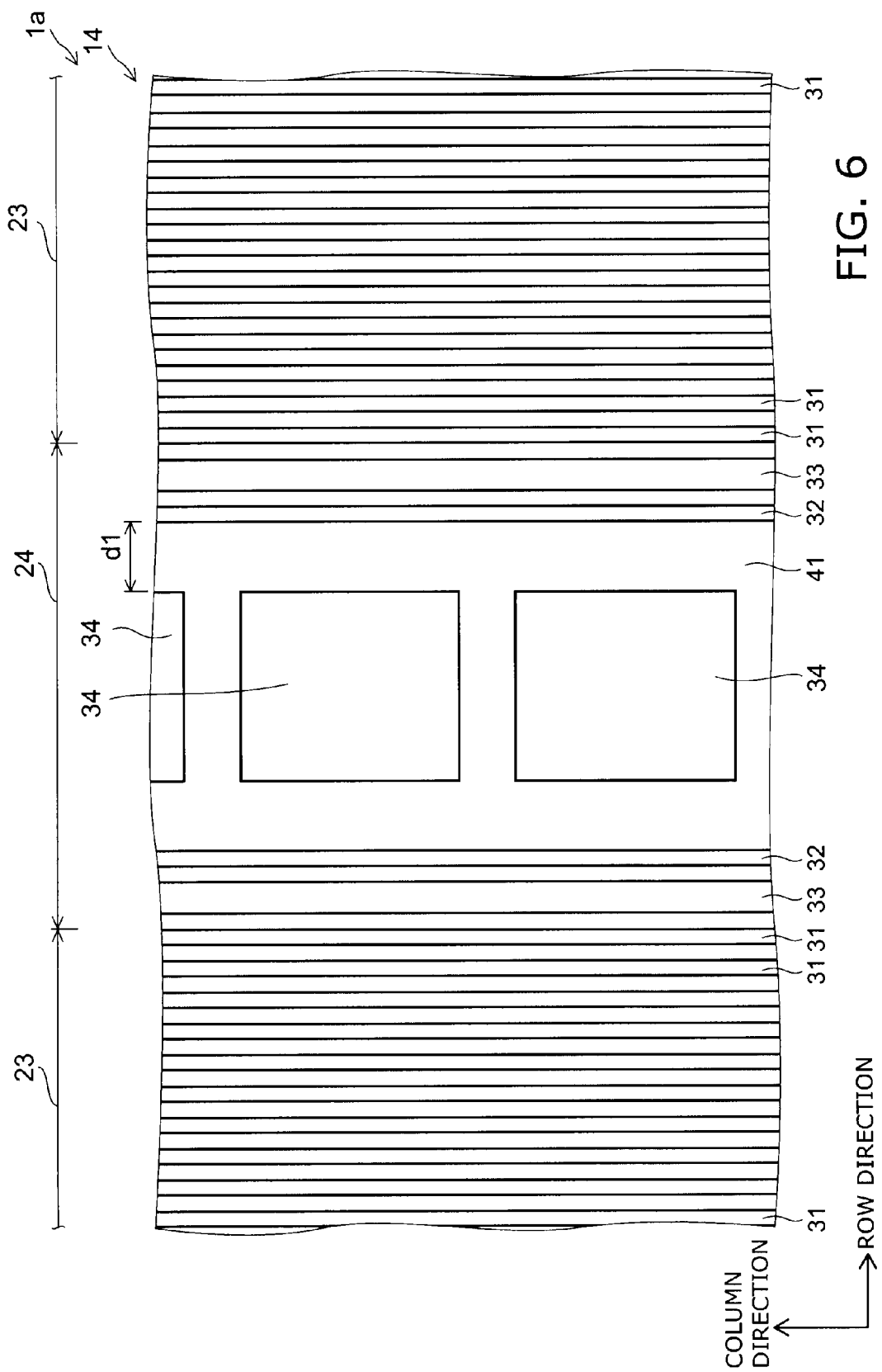
FIG. 6 is a plan view illustrating an interconnect pattern of a page buffer of a semiconductor device according to a variation of the first embodiment.

FIG. 6 is a plan view illustrating the interconnect pattern of the page buffer of the semiconductor device according to this variation.

In the semiconductor device 1a according to this variation as illustrated in FIG. 6, the width of the interconnect 32 in the shunt region 24 of the page buffer 14 is finer than that of the semiconductor device 1 (referring to FIG. 2) according to the first embodiment described above and is, for example, finer than the width of the interconnect 33. Thereby, the distance d1 between the conductive film 34 and the interconnect 32 can be even greater. Or, in the case where the distance d1 is constant, the semiconductor device can be downsized even further. The semiconductor device 1a according to this variation can be manufactured by making the width of the resist pattern 52 wider than that of the first embodiment in the process illustrated in FIG. 5A. Otherwise, the configuration, method for manufacturing, and operational effects of this variation are similar to those of the first embodiment described above. The width of the pair of interconnects 32 provided in the same shunt region 24 may be different from each other.

A second embodiment will now be described.

Figure 7:
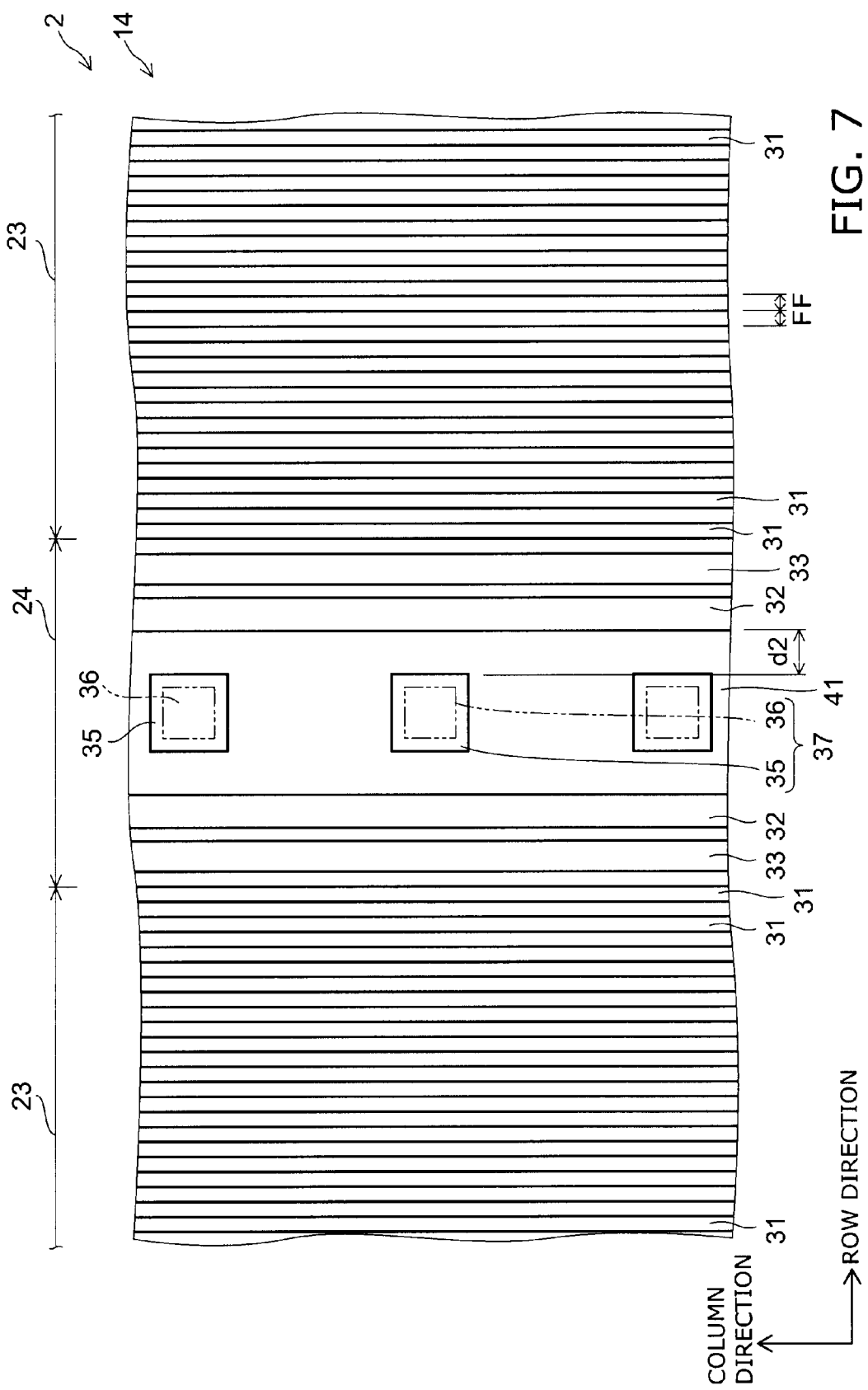
FIG. 7 is a plan view illustrating an interconnect pattern of a page buffer of a semiconductor device according to a second embodiment.

FIG. 7 is a plan view illustrating the interconnect pattern of the page buffer of the semiconductor device according to this embodiment.

In the semiconductor device 2 according to this embodiment as illustrated in FIG. 7, a conductive film is not provided in the shunt region 24 of the page buffer 14; and the contact 36 of the upper layer side is connected to the upper end of the contact 35 of the lower layer side by direct contact. A shortest distance d2 from the interconnect 32 to a coupled body 37 of the contacts 35 and 36 used as the conductive member is greater than the distance F between the mutually adjacent bit lines 31. The diffusion coefficient of the material of the contact 35 of the lower layer side in the material of the contact 36 of the upper layer side is less than the diffusion coefficient of the material of the bit line 31 and interconnects 32 and 33 in the material of the contact 36. For example, the contact 35 of the lower layer side is made of tungsten; the contact 36 of the upper layer side is made of aluminum; and the bit line 31 and the interconnects 32 and 33 are made of copper.

The method for manufacturing the semiconductor device according to this embodiment will now be described.

Figure 8:
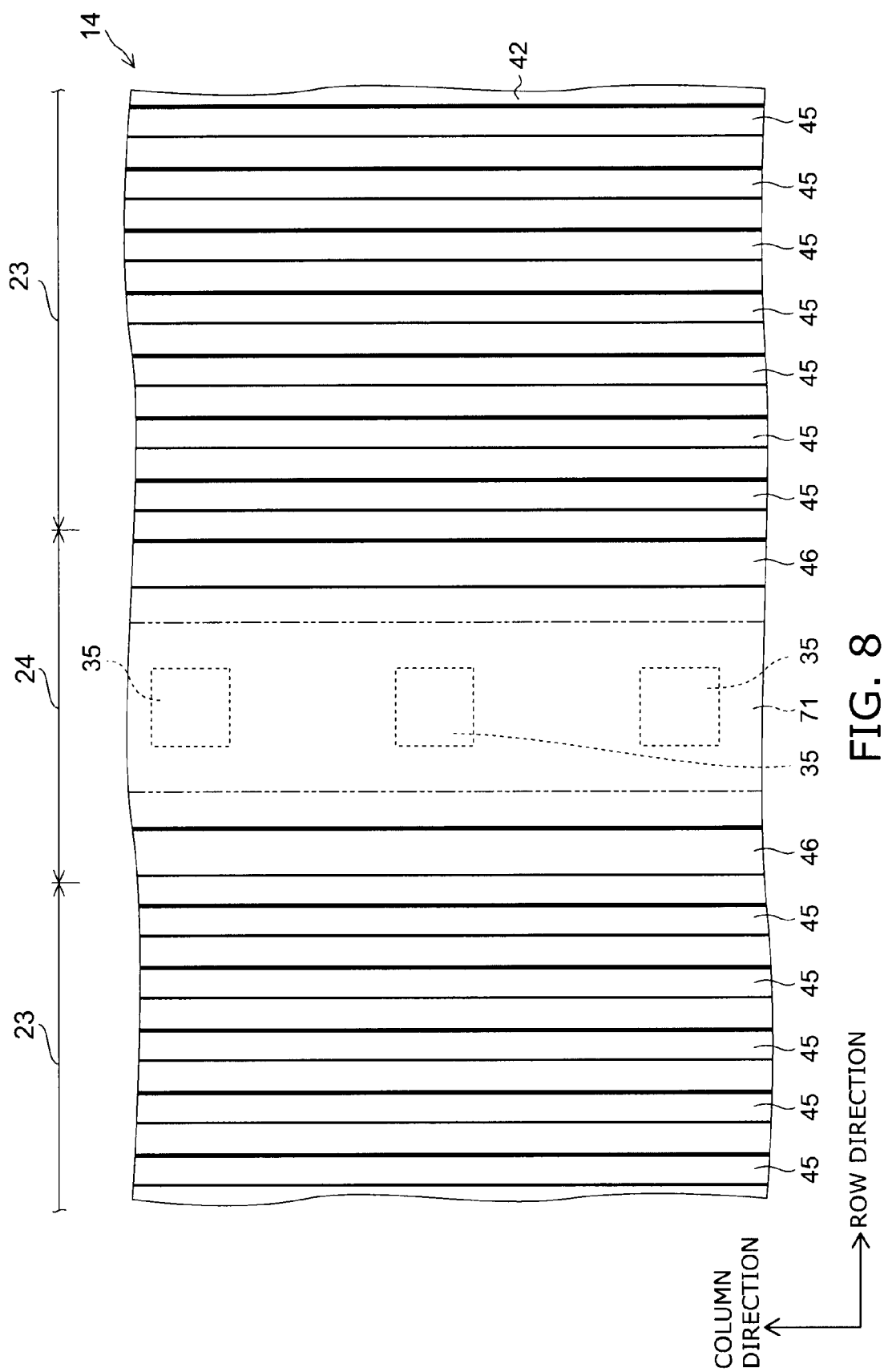
FIG. 8 is a process plan view illustrating a method for manufacturing the semiconductor device according to the second embodiment.

FIG. 8 is a process plan view illustrating the method for manufacturing the semiconductor device according to this embodiment.

In this embodiment as illustrated in FIG. 8, a resist pattern 71 is formed instead of the resist pattern 52 (referring to FIG. 3) in the process illustrated in FIG. 5A described above. The resist pattern 71 is provided in the region of the shunt region 24 excluding both row-direction end portions to extend in a band configuration in the column direction. An opening is not provided in the resist pattern 71; and the resist pattern 71 covers the entire upper face of the contact 35. Therefore, even in the case where the etching is performed in the process illustrated in FIG. 5B, the recess 60 is not made and the upper face of the contact 35 is not exposed. As a result, the conductive film 34 is not formed in the process illustrated in FIG. 5C. Here, the distance between the resist pattern 71 and the line pattern 46 is the width of the interconnect 32.

Subsequently, in the process illustrated in FIG. 5D, the inter-layer insulating film 63 is formed on the inter-layer insulating film 41. Then, a contact hole is made in the inter-layer insulating film 63 in the region directly on the contact 35 to expose the upper face of the contact 35. Continuing, a metal material, e.g., aluminum, is filled into the contact hole to form the contact 36. As a result, the coupled body 37 of the contacts 35 and 36 is formed.

Here, in the case where the contact 36 is larger than the contact 35 as viewed from above, the resist pattern 71 is formed such that the distance between the end portion of the resist pattern 71 and the contact 36 is the shortest distance d2. Conversely, in the case where the contact 36 is smaller than the contact 35 as viewed from above, the resist pattern 71 is formed such that the distance between the end portion of the resist pattern 71 and the contact 35 is the shortest distance d2.

In this embodiment as well, similarly to the first embodiment described above, a higher potential can be applied to the contacts 36 and 35 via the upper layer interconnect because the shortest distance d2 from the interconnect 32 to the coupled body 37 of the contacts 35 and 36 is greater than the distance F between the mutually adjacent bit lines 31. Further, because the conductive film 34 (referring to FIG. 2) is not provided, the semiconductor device can be downsized even further. Otherwise, the configuration, method for manufacturing, and operational effects of this embodiment are similar to those of the first embodiment described above.

A barrier metal layer may be formed on the surface of the contact 36 to prevent the diffusion of the metal material used to form the contact 36. The barrier metal layer may be formed of, for example, titanium (Ti) or titanium nitride (TiN). In such a configuration, in the case where shifting occurs between the conductive film 34 and the contact 36 of the first embodiment described above, a region not covered with the barrier metal layer may be formed at the side face of the conductive film 34 in the case where the side face of the conductive film 34 contacts the side face of the contact 36 because the barrier metal layer of the contact 36 does not easily extend around onto the side face of the conductive film 34. As a result, the side face of the contact 36 directly contacts the side face of the conductive film 34 without the barrier metal layer interposed therebetween. In such a case, because the diffusion coefficient of copper in aluminum is relatively high, the copper diffuses into the aluminum to form voids in the conductive film 34; the copper reacts with the aluminum of the contact 36 to undesirably form high-resistance intermetallic compounds, e.g., AlCu; and the resistance between the conductive film 34 and the contact 36 undesirably increases. If the conductive film 34 is formed sufficiently wide, the disposition position of the contact 36 does not extend outside the region directly on the conductive film 34; and the contact 36 and the conductive film 34 are prevented from directly contacting without the barrier metal layer interposed therebetween. However, in such a case, downsizing of the semiconductor device is obstructed because the surface area of the conductive film 34 increases.

Conversely, according to this embodiment, the diffusion coefficient of the material of the contact 35 in the material of the contact 36 is relatively low by forming the contact 35 of tungsten and by forming the contact 36 of aluminum. As a result, intermetallic compounds do not easily occur and the resistance does not easily increase even in the case where the side face of the contact 35 directly contacts the side face of the contact 36 without the barrier metal interposed therebetween. Moreover, because the conductive film 34 having a width wider than those of the contacts 35 and 36 as viewed from above is not provided between the contact 35 and the contact 36, the resistance between the contact 35 and the contact 36 is prevented from increasing; and the downsizing of the semiconductor device 1 can be realized.

A variation of this embodiment will now be described.

Figure 9:
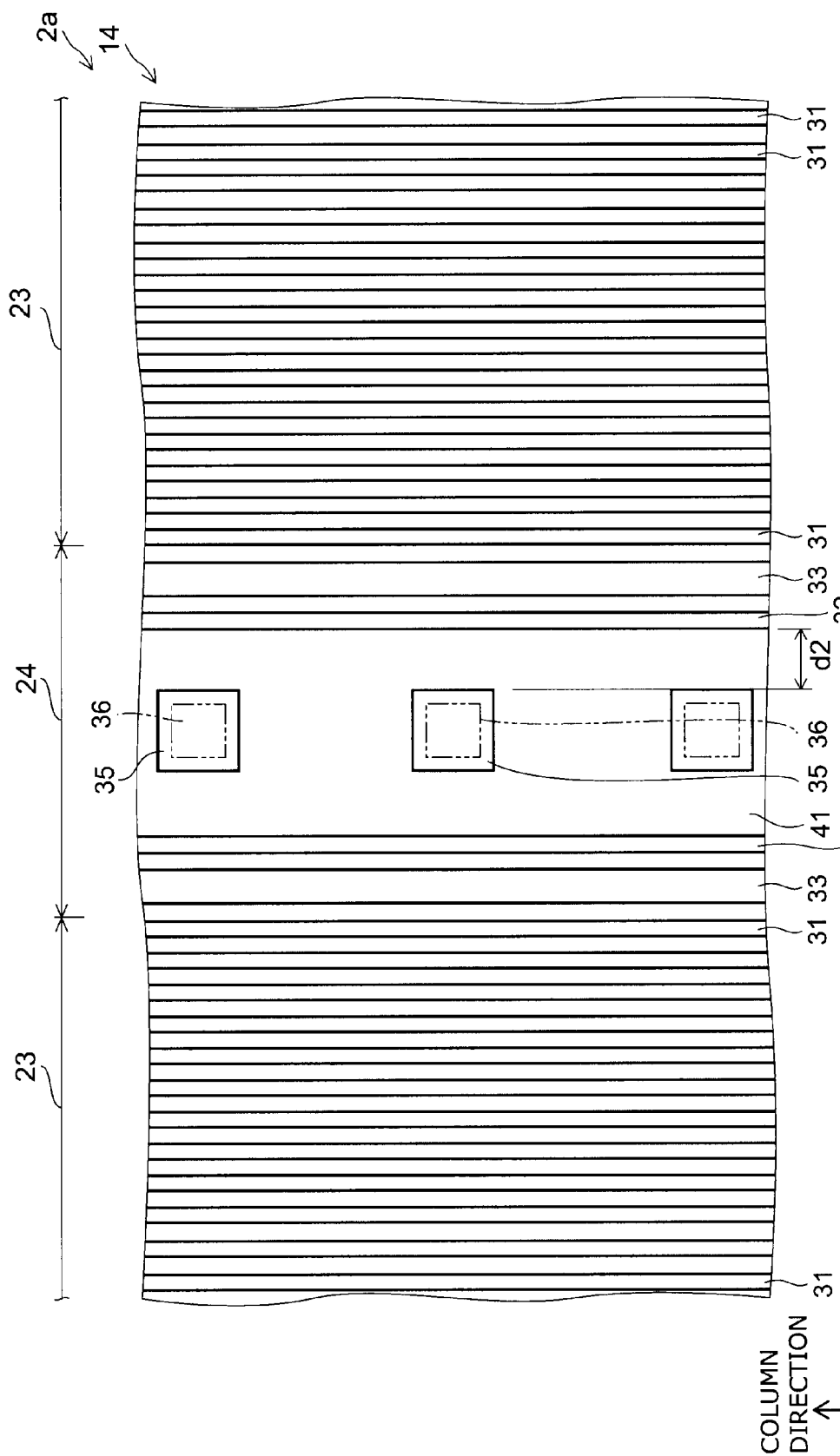
FIG. 9 is a plan view illustrating an interconnect pattern of a page buffer of a semiconductor device according to a variation of the second embodiment.

FIG. 9 is a plan view illustrating the interconnect pattern of the page buffer of the semiconductor device according to this variation.

Similarly to the variation of the first embodiment described above, this variation is an example in which the width of the interconnect 32 is finer than that of the second embodiment as illustrated in FIG. 9. Thereby, the distance d2 can be increased. Such a semiconductor device 2a can be manufactured by increasing the width of the resist pattern 71 of the second embodiment described above. Otherwise, the configuration, method for manufacturing, and operational effects of this variation are similar to those of the second embodiment described above. The width of the pair of interconnects 32 provided in the same shunt region 24 may be different from each other.

A third embodiment will now be described.

Figure 10:
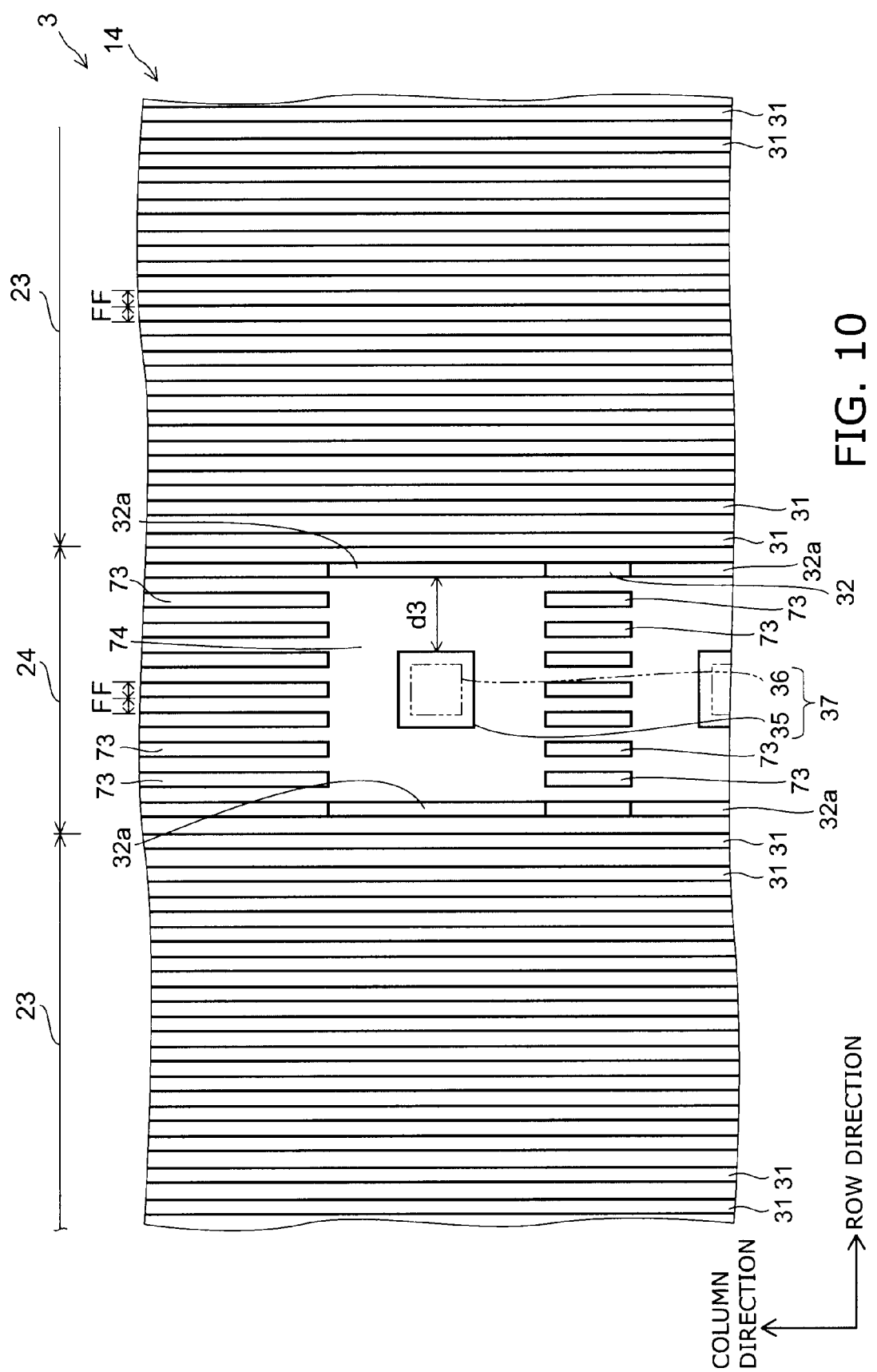
FIG. 10 is a plan view illustrating an interconnect pattern of a page buffer of a semiconductor device according to a third embodiment.

FIG. 10 is a plan view illustrating the interconnect pattern of the page buffer of the semiconductor device according to this embodiment.

In the semiconductor device 3 according to this embodiment as illustrated in FIG. 10, the conductive film is not provided in the shunt region 24 of the page buffer 14; and the lower end of the contact 36 of the upper layer side is connected to the upper end of the contact 35 of the lower layer side by direct contact. Further, the interconnect 33 (referring to FIG. 2) is not provided. Also, the width of the interconnect 32 is substantially equal to the width of the bit line 31, e.g., F.

Moreover, in this embodiment, multiple dummy interconnects 73, e.g., seven dummy interconnects 73, are provided at positions on each column-direction side of the coupled body 37 of the contact 35 and the contact 36 between a pair of the interconnects 32 disposed on two sides of the coupled body 37 respectively. The dummy interconnects 73 are not provided in a rectangular region 74 centered on the coupled body 37. In other words, the dummy interconnects 73 are discontinuous in the region 74. The dummy interconnects 73 are disposed alternately with the region 74 in the column direction.

The width of the dummy interconnect 73 is substantially equal to the width of the bit line 31, e.g., F. The distance between the mutually adjacent dummy interconnects 73 is substantially equal to the distance between the mutually adjacent bit lines 31, e.g., F. In other words, the widths of all of the bit lines 31, the interconnects 32, and the dummy interconnects 73 and the distances therebetween are all F. Accordingly, the bit line 31, the interconnect 32, and the dummy interconnect 73 are arranged periodically along the row direction. A shortest distance d3 from the interconnect 32 to the coupled body 37 of the contacts 35 and 36 used as the conductive member is greater than the distance F between the mutually adjacent bit lines 31. Similarly to the second embodiment described above, the contact 35 is formed of tungsten; the contact 36 is formed of aluminum; and the bit line 31, the interconnect 32, and the dummy interconnect 73 are formed of copper.

The method for manufacturing the semiconductor device according to this embodiment will now be described.

Figure 11:
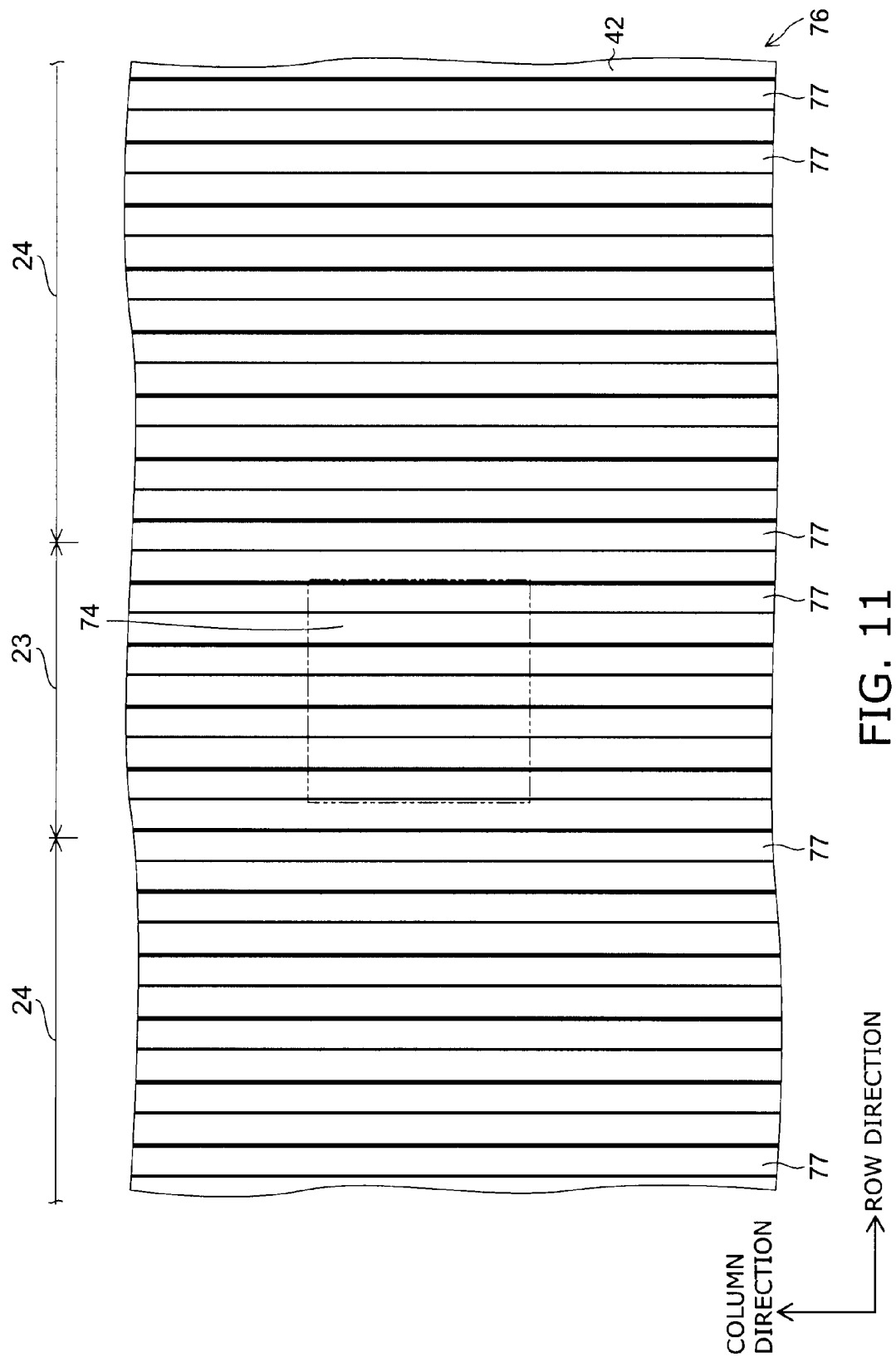
FIG. 11 is a process plan view illustrating a method for manufacturing the semiconductor device according to the third embodiment.
Figure 12:
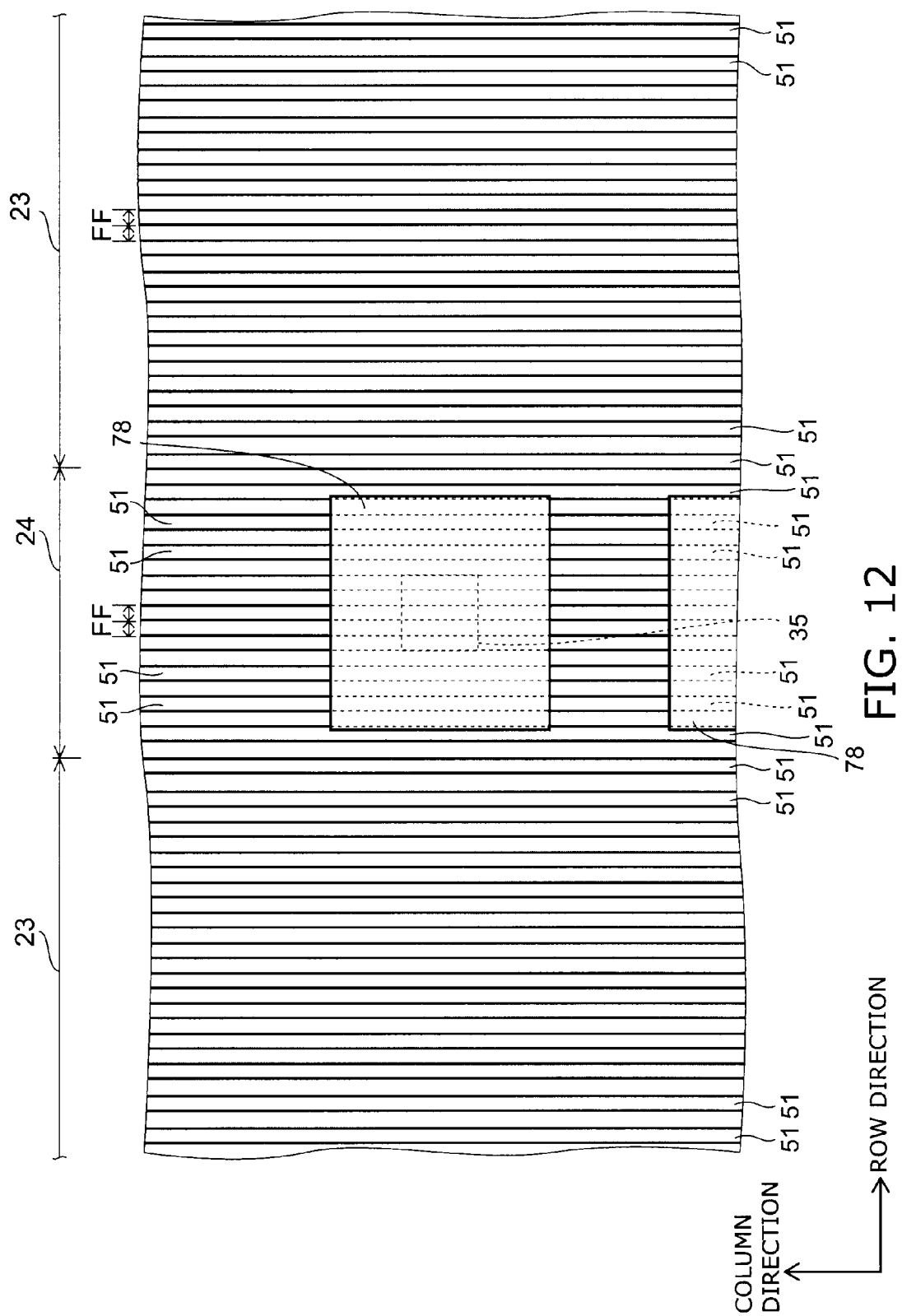
FIG. 12 is a process plan view illustrating the method for manufacturing the semiconductor device according to the third embodiment.

FIG. 11 and FIG. 12 are process plan views illustrating the method for manufacturing the semiconductor device according to this embodiment.

In this embodiment as illustrated in FIG. 11, a resist pattern 76 is formed instead of the resist pattern 43 (referring to FIG. 3) in the process illustrated in FIG. 4A described above. In the resist pattern 76, multiple line patterns 77 are arranged periodically to extend in the column direction in both the bit line region 23 and the shunt region 24. The width of the line pattern 77 is taken to be 2F; and the distance between the mutually adjacent line patterns 77 also is taken to be 2F. Then, as illustrated in FIG. 4B, the mask pattern 47 is formed by patterning the inter-layer insulating film 42 using the resist pattern 76 as a mask; slimming of the mask pattern 47 is performed as illustrated in FIG. 4C; and the sidewalls 51 are formed on the side faces of the line portions 48 of the mask pattern 47 as illustrated in FIG. 4D. Thereby, as illustrated in FIG. 12, the sidewall 51 having a width and a spacing of F is formed in both the bit line region 23 and the shunt region 24.

Subsequently, in the process illustrated in FIG. 5A, a resist pattern 78 (referring to FIG. 12) is formed instead of the resist pattern 52 (referring to FIG. 3). The resist pattern 78 is formed in the region that becomes the region 74. The resist pattern 78 is formed to cover the entire upper face of the contact 35. Thereby, the inter-layer insulating film 41 is not etched and the trenches and the recess are not made in the region 74 when the etching in the process illustrated in FIG. 5B is performed because although the sidewall 51 is formed in the region 74, the entire region 74 is covered with the resist pattern 78. Therefore, the interconnects and the conductive film are not formed in the region 74 in the process illustrated in FIG. 5C. On the other hand, the dummy interconnects 73 are formed on both column-direction sides as viewed from the region 74.

Subsequently, the inter-layer insulating film 63 is formed on the inter-layer insulating film 41 in the process illustrated in FIG. 5D. Then, a contact hole is made in the inter-layer insulating film 63 in the region directly on the contact 35 to expose the upper face of the contact 35. Then, the contact 36 is formed by filling a metal material, e.g., aluminum, into the contact hole. As a result, the coupled body 37 of the contacts 35 and 36 is formed.

In the case where the contact 36 is larger than the contact 35 as viewed from above, the resist pattern 78 is formed such that the distance between the end portion of the resist pattern 78 and the contact 36 is the shortest distance d3. Conversely, in the case where the contact 36 is smaller than the contact 35 as viewed from above, the resist pattern 78 is formed such that the distance between the end portion of the resist pattern 78 and the contact 35 is the shortest distance d3.

Operational effects of this embodiment will now be described.

In the process illustrated in FIG. 4A in this embodiment, the resolution of the exposure when forming the resist pattern 76 can be improved because the periodically-arranged multiple line patterns 77 are provided not only in the bit line region 23 but also in a portion of the shunt region 24. Otherwise, the configuration, method for manufacturing, and operational effects of this embodiment are similar to those of the second embodiment described above. There are cases where the width of a portion 32a of the interconnect 32 facing the region 74 fluctuates in the case where the dimension and the formation position of the resist pattern 78 fluctuate. In such a case, the portion 32a becomes a protrusion of the interconnect 32 protruding toward the region 74 or a recess of the portion 32a receding from the region 74.

A variation of this embodiment will now be described.

Figure 13:
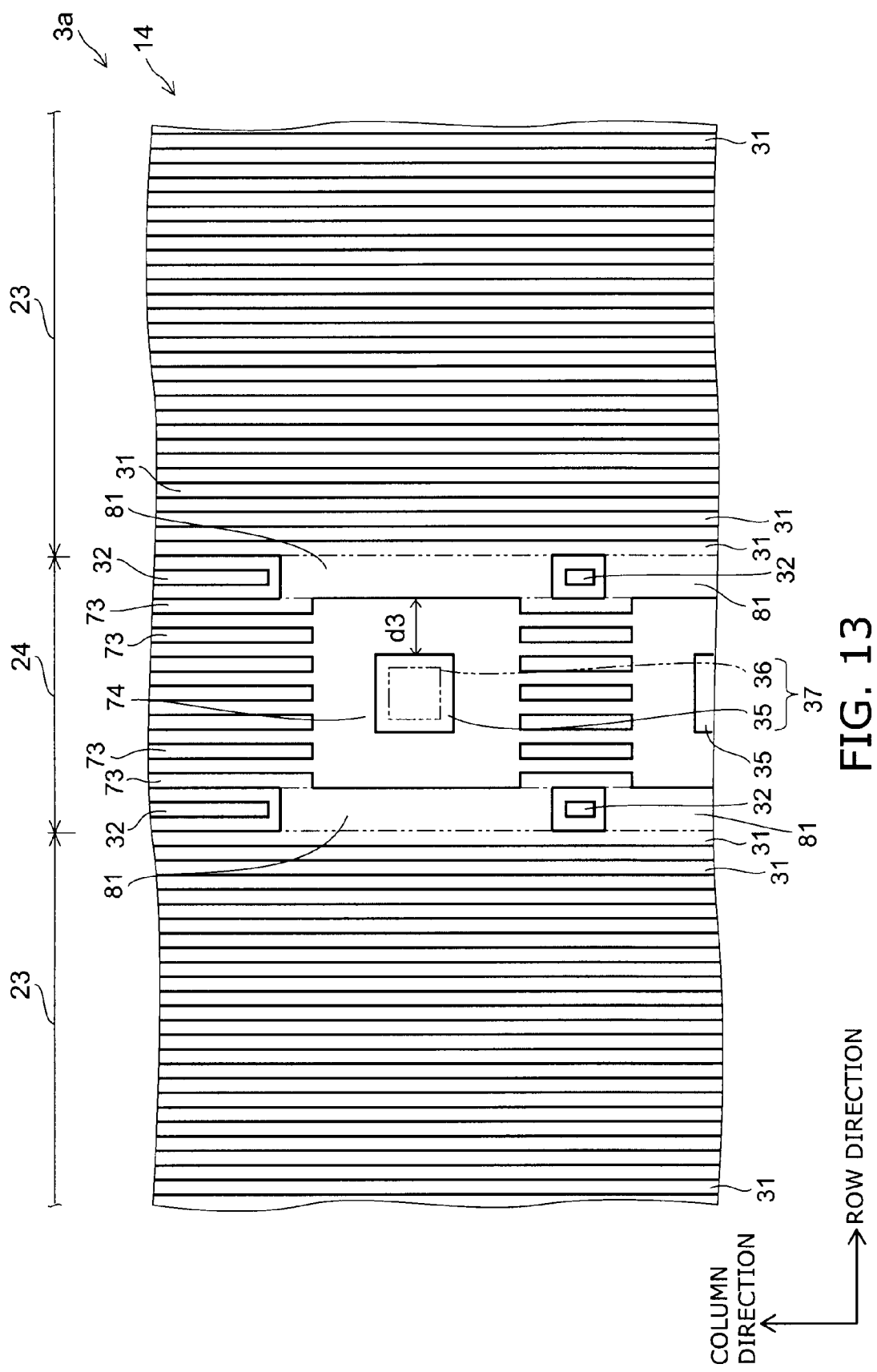
FIG. 13 is a plan view illustrating an interconnect pattern of a page buffer of a semiconductor device according to a variation of the third embodiment.

FIG. 13 is a plan view illustrating the interconnect pattern of the page buffer of the semiconductor device according to this variation.

In the semiconductor device 3a according to this variation as illustrated in FIG. 13, a conductive film 81 is provided in addition to the configuration of the semiconductor device 3 (referring to FIG. 10) according to the third embodiment described above. The configuration of the conductive film 81 as viewed from above is a rectangular configuration having the longitudinal direction in the column direction. The conductive film 81 is disposed on both row-direction sides as viewed from the region 74 to protrude slightly from the region 74 at both column-direction sides. The conductive film 81 is connected from the bit line 31 of the multiple bit lines 31 provided in the bit line region 23 disposed most toward the dummy interconnect 73 side to the dummy interconnect 73 of the multiple dummy interconnects 73 provided in the shunt region 24 disposed most toward the bit line 31 side. Actually, the bit line 31 disposed most toward the dummy interconnect 73 side, the conductive film 81, and the dummy interconnect 73 disposed most toward the bit line 31 side are integrally formed; and there is no boundary therebetween. On the other hand, the interconnect 32 is not provided in the region where the conductive film 81 is disposed. Further, the interconnect 32 does not contact the conductive film 81. Accordingly, the conductive film 81 is interposed in the layout region of the interconnect 32 to divide the interconnect 32.

The method for manufacturing the semiconductor device according to this variation will now be described.

Figure 14:
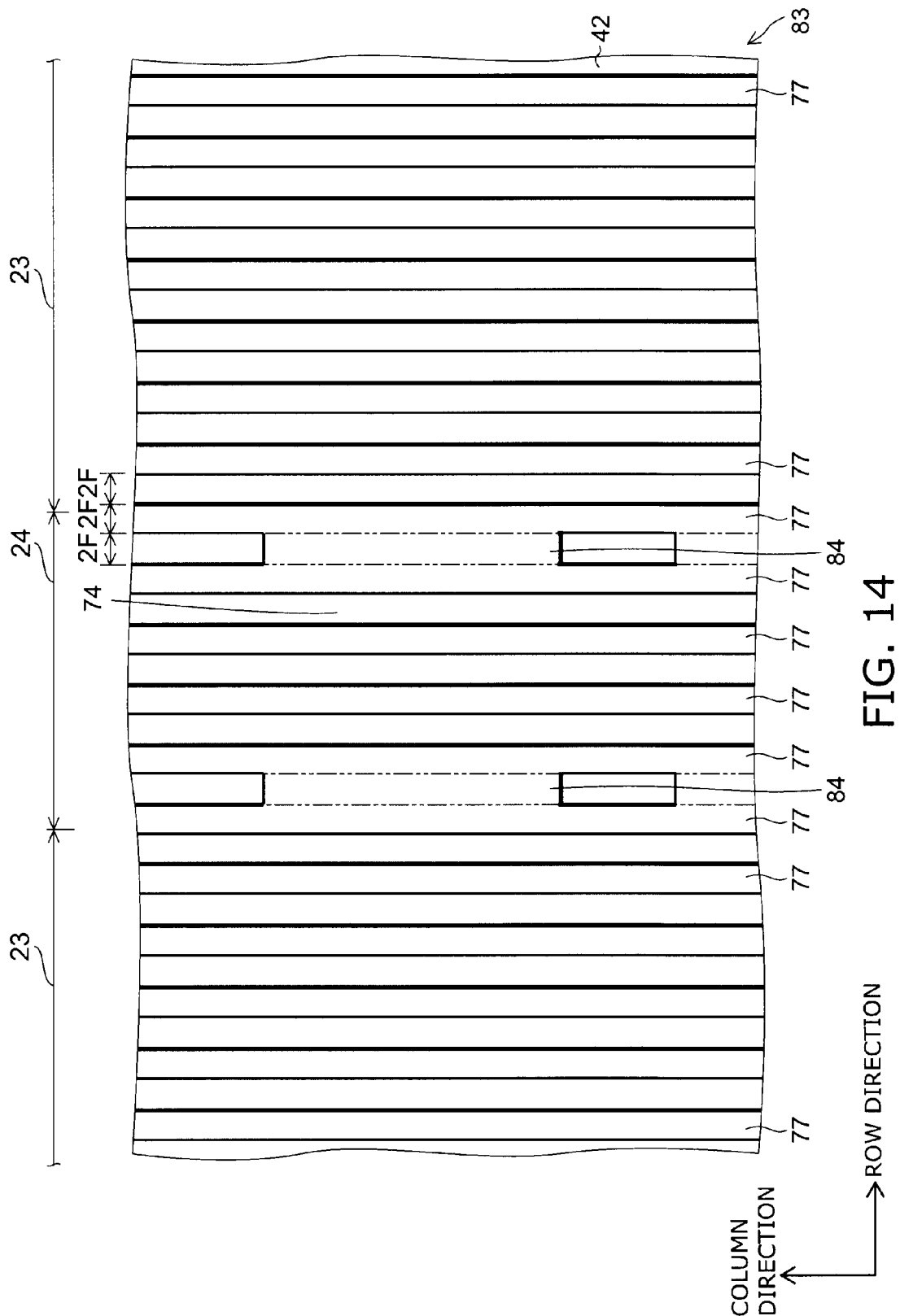
FIG. 14 is a process plan views illustrating a method for manufacturing the semiconductor device according to the variation of the third embodiment.
Figure 15:
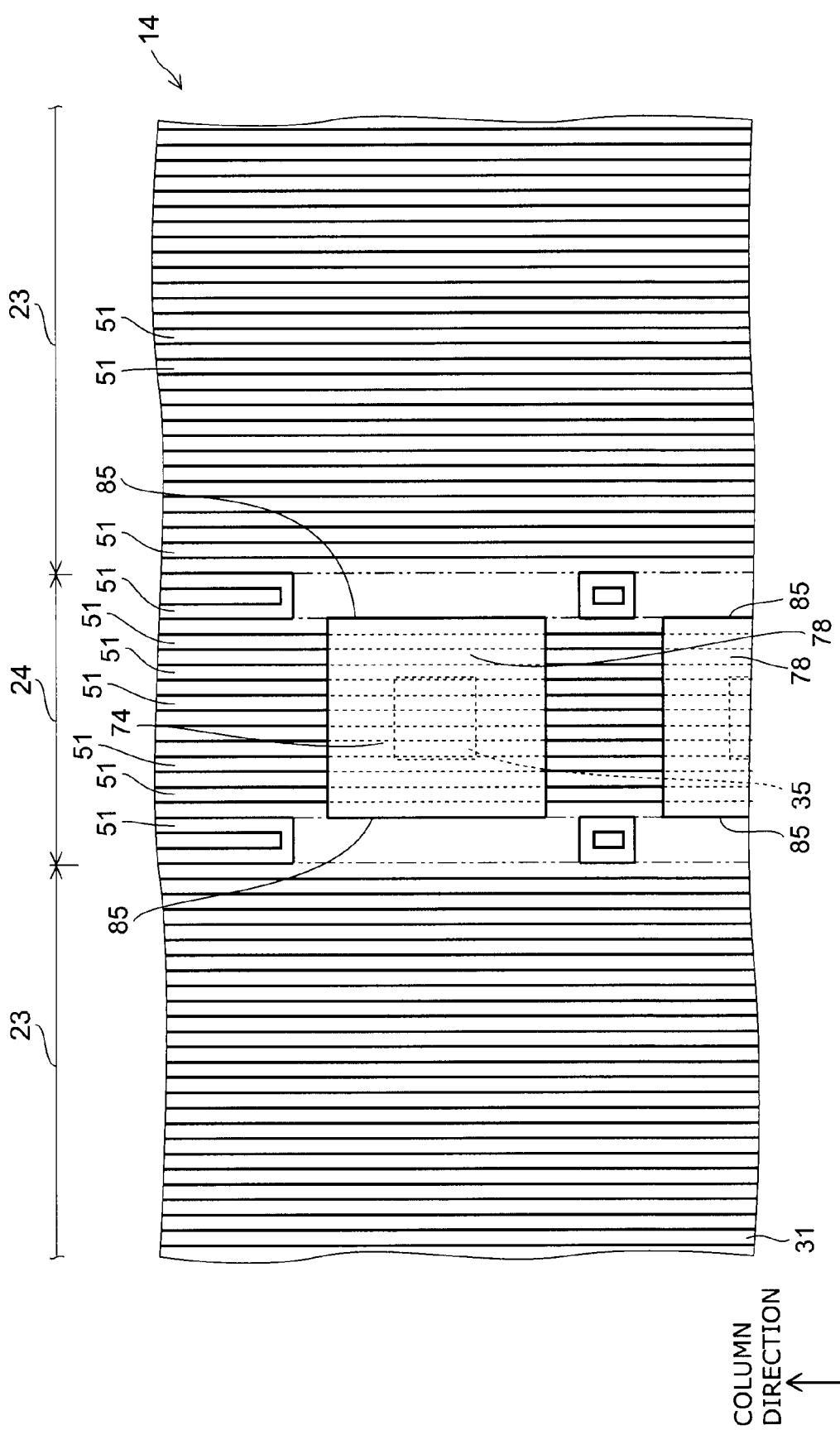
FIG. 15 is a process plan views illustrating the method for manufacturing the semiconductor device according to the variation of the third embodiment.

FIG. 14 and FIG. 15 are process plan views illustrating the method for manufacturing the semiconductor device according to this variation.

In this variation as illustrated in FIG. 14, a resist pattern 83 is formed instead of the resist pattern 76 (referring to FIG. 11) in the process illustrated in FIG. 4A. In the resist pattern 83, in addition to the periodically-arranged multiple line patterns 77, a pair of line patterns 84 are provided in regions on both row-direction sides as viewed from the region 74 to contact the region 74 and protrude slightly from the region 74 at both column-direction sides. The configuration of the line pattern 84 as viewed from above is a rectangular configuration extending in the column direction with a width of 2F. The line pattern 84 is disposed to fill between the mutually adjacent line patterns 77. Therefore, actually, the line pattern 84 and the line patterns 77 adjacent to the line pattern 84 are integrally formed; and there is no boundary therebetween. Subsequently, although the sidewalls 51 are formed by performing the processes illustrated in FIGS. 4B to 4D, the sidewalls 51 are not formed on the end edges of the line patterns 77 contacting the line pattern 84.

Subsequently, as illustrated in FIG. 15, the resist pattern 78 is formed instead of the resist pattern 52 (referring to FIG. 3) in the process illustrated in FIG. 5A. The resist pattern 78 is formed in the portion corresponding to the region 74. The resist pattern 78 is formed to cover the entire upper face of the contact 35. Thereby, the inter-layer insulating film 41 is not etched and the trenches and the recess are not made in the region 74 when the etching in the process illustrated in FIG. 5B is performed because although the sidewall 51 is formed in the region 74, the entire region 74 is covered with the resist pattern 78. Therefore, the interconnects and the conductive film are not formed in the region 74 in the process illustrated in FIG. 5C. On the other hand, the dummy interconnects 73 are formed on both column-direction sides as viewed from the region 74. As a result, a recess 85 is made in the region where the line pattern 84 (referring to FIG. 14) was formed and in the region of the line pattern 77 on both sides thereof in the process illustrated in FIG. 4A. Subsequently, the conductive film 81 is formed in the recess 85 by performing the process of FIG. 5C. As a result, the bit line 31 disposed most toward the dummy interconnect 73 side, the conductive film 81, and the dummy interconnect 73 disposed most toward the bit line 31 side are integrally formed. The interconnect 32 is divided in the column direction by the sidewall 51 formed on the column-direction side face of the line pattern 84.

According to this variation, by connecting one bit line 31 and one dummy interconnects 73 by one conductive film 81, the conductor made of the one bit line 31, the one dummy interconnects 73, and the one conductive film 81 can be used as one interconnect. In such a case, the bit line 31 connected to the dummy interconnect 73 by the conductive film 81 is used as a dummy interconnect. Such an interconnect is wider than a normal bit line 31 by the amount connecting the one dummy interconnect 73 to the one conductive film 81. Accordingly, the voltage drop is lower than that of a single bit line 31 not connected to the conductive film 81. Therefore, a high shield voltage can be applied up to the end portion of the dummy interconnect; and the read-out operations and the like of the memory cells can be performed stably.

The width of the conductive film 81 positioned on both row-direction sides as viewed from the coupled body 37 is about three times the width of the bit line 31. The width of the coupled interconnect having the dummy interconnect 73 added to the conductive film 81 is about four times the width of the bit line 31. Therefore, even in the case where the width and the formation position of the resist pattern 78 fluctuate, the fluctuation can be absorbed by the conductive film 81 and the dummy interconnect 73. In other words, even in the case where the width and the formation position of the resist pattern 78 fluctuate, the width of the coupled interconnect of the combination of the conductive film 81 and the dummy interconnect 73 changes but is not discontinuous. Thereby, the operations of the semiconductor device 1 can be stabilized even in the case where process fluctuation occurs. Otherwise, the configuration, method for manufacturing, and operational effects of this variation are similar to those of the third embodiment described above.

According to the embodiments described above, a semiconductor device and a method for manufacturing the same can be realized in which periodically-arranged multiple interconnects and conductive members are provided and a voltage higher than that applied to the interconnects can be applied to the conductive members.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a plurality of first interconnects arranged periodically to extend in one direction;
a second interconnect disposed outside a group of the plurality of first interconnects to extend in the one direction;
a third interconnect provided between the group and the second interconnect; and
a plurality of conductive members disposed on a side opposite to the group as viewed from the second interconnect,
a shortest distance between the first interconnect and the third interconnect, a shortest distance between the third interconnect and the second interconnect, and a shortest distance between the first interconnects being equal, a shortest distance between the second interconnect and the conductive member being longer than the shortest distance between the first interconnects.

2. The device according to claim 1, wherein
the conductive member is a conductive film formed in a same interconnect layer as the first interconnect, the second interconnect, and the third interconnect, and
the device further comprises:
a first contact provided below the conductive film, an upper end of the first contact being connected to the conductive film; and
a second contact provided above the conductive film, a lower end of the second contact being connected to the conductive film.

3. The device according to claim 1, wherein
the conductive member is a contact extending in a direction piercing an interconnect layer including the first interconnect and the second interconnect, and
the device further comprises one other contact connected to the contact,
a diffusion coefficient of a material of a lower-disposed contact selected from the contact and the one other contact in a material of a higher-disposed contact selected from the contact and the one other contact being less than a diffusion coefficient of a material of the first interconnect in the material of the higher-disposed contact.

4. The device according to claim 3, wherein the higher-disposed contact is made of aluminum, the lower-disposed contact is made of tungsten, and the first interconnect is made of copper.

5. The device according to claim 1, further comprising a plurality of fourth interconnects provided at positions on two sides of the conductive member in the one direction between a pair of the second interconnects disposed on two sides of the conductive member respectively, a width of the fourth interconnect being equal to a width of the first interconnect,
the first interconnect, the second interconnect, the third interconnect, and the fourth interconnect being arranged periodically.

6. The device according to claim 5, further comprising a conductive film disposed in a direction of the arrangement as viewed from the conductive member and connected between the first interconnect of the plurality of first interconnects disposed most toward the fourth interconnect side and the fourth interconnect of the plurality of fourth interconnects disposed most toward the first interconnect side.

7. The device according to claim 1, wherein a width of the third interconnect is greater than a width of the first interconnect.

8. The device according to claim 1, wherein the group and the conductive member are disposed alternately along an arrangement direction of the first interconnect.

9. The device according to claim 1, wherein the plurality of conductive members are arranged in one series along the one direction.

10. The device according to claim 1, wherein the first interconnect and the third interconnect are formed by a sidewall method and a damascene process, and the second interconnect is formed by making a trench in an insulating film and filling a conductive material into the trench, the trench is made by using a sidewall formed using the sidewall method and a resist pattern as a mask.

11. The device according to claim 1, wherein
the device is a NAND nonvolatile semiconductor memory device, and
the first interconnect is a bit line.

12. A method for manufacturing a semiconductor device, comprising:
forming a first insulating film on a semiconductor substrate, a first region and a second region being set alternately in the semiconductor substrate along a first direction;
forming a second insulating film on the first insulating film;
forming a third insulating film on the second insulating film;
forming a first resist pattern on the third insulating film, the first resist pattern including a plurality of line patterns arranged periodically along the first direction in the second region to extend in a second direction orthogonal to the first direction;
dividing the third insulating film into a plurality of line portions by etching method using the first resist pattern as a mask;
reducing a width of the line portion;
forming a sidewall on a side face of the line portion;
removing the line portion;
forming a second resist pattern in a region of the first region separated from the sidewall, an opening being provided in an interior of the second resist pattern;
making a trench in a region of the second insulating film between the sidewalls and in a region of the second insulating film between the sidewall and the second resist pattern, and making a recess in a region of the second insulating film directly under the opening, by etching method using the sidewall and the second resist pattern as a mask; and
forming an interconnect in an interior of the trench and a conductive film in an interior of the recess by filling a conductive material into the interior of the trench and the interior of the recess,
a shortest distance from the opening to an outer edge of the second resist pattern on the second region side being longer than a width of the sidewall.

13. The method according to claim 12, wherein a plurality of the openings are arranged periodically along the second direction, in the forming of the second resist pattern.

14. The method according to claim 12, further comprising:
forming a first contact in the first insulating film in the first region; and
forming a second contact on the conductive film to connect to the conductive film,
the conductive film being formed to connect to the first contact.

15. The method according to claim 12, wherein
the method is a method for manufacturing a NAND nonvolatile semiconductor memory device, and
the first interconnect is a bit line.

16. A method for manufacturing a semiconductor device, comprising:
forming a first insulating film on a semiconductor substrate, a first region and a second region being set alternately in the semiconductor substrate along a first direction;
forming a first contact in the first insulating film in the first region;
forming a second insulating film on the first insulating film;
forming a third insulating film on the second insulating film;
forming a first resist pattern on the third insulating film, the first resist pattern including a plurality of line patterns arranged periodically along the first direction in the second region to extend in a second direction orthogonal to the first direction;

dividing the third insulating film into a plurality of line portions by etching method using the first resist pattern as a mask;

reducing a width of the line portion;

forming a sidewall on a side face of the line portion;

removing the line portion;

forming a second resist pattern in a region of the first region separated from the sidewall;

making a trench in a region of the second insulating film between the sidewalls and in a region of the second insulating film between the sidewall and the second resist pattern by etching method using the sidewall and the second resist pattern as a mask;

forming a first interconnect in an interior of the trench made in the region between the sidewalls and a second interconnect in an interior of the trench made in the region between the sidewall and the second resist pattern by filling a conductive material in the interiors of the trench made in the region between the sidewalls and the trench made in the region between the sidewall and the second resist pattern; and forming a second contact on the first contact to connect the first contact, a shortest distance between the first contact and the second interconnect and a shortest distance between the second contact and the second interconnect being greater than a shortest distance between the first interconnects.

17. The method according to claim 16, wherein the line pattern is formed also in the first region and the line pattern formed in the first region and the line pattern formed in the second region are arranged periodically along the first direction, in the forming of the first resist pattern.

18. The method according to claim 16, wherein a plurality of the first contacts are arranged periodically along the second direction, in the forming of the first contact.

19. The method according to claim 16, wherein a diffusion coefficient of a material of the first contact in a material of the second contact is less than a diffusion coefficient of the conductive material in the material of the second contact.

20. The method according to claim 19, wherein the first contact is formed of tungsten, the second contact is formed of aluminum, and the conductive material is copper.

* * * * *